(12) United States Patent
Easwaran et al.

(10) Patent No.: US 9,285,816 B2
(45) Date of Patent: Mar. 15, 2016

(54) HARVESTING POWER FROM DC (DIRECT CURRENT) SOURCES

(76) Inventors: Prakash Easwaran, Bangalore (IN); Saumitra Singh, Bangalore (IN); Rupak Ghayal, Bangalore (IN); Amit Premy, Bangalore (IN)

(*) Notice: Subject to any disclaimer, the term of this patent is extended or adjusted under 35 U.S.C. 154(b) by 1136 days.

(21) Appl. No.: 13/071,531

(22) Filed: Mar. 25, 2011

(65) Prior Publication Data
US 2012/0193986 A1 Aug. 2, 2012

(30) Foreign Application Priority Data
Jan. 28, 2011 (IN) .............................. 268/CHE/2011

(51) Int. Cl.
*G01J 1/20* (2006.01)
*G05F 1/67* (2006.01)
(Continued)

(52) U.S. Cl.
CPC *G05F 1/67* (2013.01); *H01L 31/05* (2013.01); *H01L 31/0504* (2013.01); *H02S 50/10* (2014.12); *H02J 3/385* (2013.01); *Y02E 10/50* (2013.01); *Y02E 10/58* (2013.01); *Y10T 307/609* (2015.04); *Y10T 307/685* (2015.04)

(58) Field of Classification Search
CPC ..... Y02E 10/50; Y02E 10/58; H01L 31/0428; H01L 31/05; H01L 31/0504; G05F 1/67
USPC .......... 250/203.4; 136/244, 252, 293; 307/84, 307/77, 78
See application file for complete search history.

(56) References Cited

U.S. PATENT DOCUMENTS 6,316,925 B1 * 11/2001 Canter .......................... 323/282
7,772,716 B2 8/2010 Shaver, II et al.
(Continued)

FOREIGN PATENT DOCUMENTS

WO 2010037393 A1 4/2010

OTHER PUBLICATIONS

K. K. Tse, M. T. Ho, Henry S.-H. Chung and S. Y. (Ron) Hui, "A Novel Maximum Power Point Tracker for PV Panels Using Switching Frequency Modulation", IEEE Transactions on Power Electronics, vol. 17, No. 6, Dated Nov. 2002, pp. 980-989.

(Continued)

*Primary Examiner* — Georgia Y Epps
*Assistant Examiner* — Kevin Wyatt
(74) *Attorney, Agent, or Firm* — Heena N. Kampani; Law Office of Heena N. Kampani

(57) ABSTRACT

In a solar panel array, each solar panel in a series-connected string has a current source connected across its output terminals. The current source generates a programmable output current equal to the difference of the load current drawn from the panel and the current corresponding to the maximum power point (MPP) of the panel. As a result, each of the panels in the string is operated at its MPP. When the array contains multiple strings connected in parallel, a voltage source is additionally connected in series with each string. The voltage sources are programmable to generate corresponding output voltages to enable operation of each panel in each of the multiple strings at its MPP. Respective control blocks providing the current sources and voltage sources automatically determine the MPP of the corresponding panels. In an embodiment, the control blocks are implemented as DC-DC converters in conjunction with measurement and communication units.

17 Claims, 12 Drawing Sheets

(51) Int. Cl.
*H01L 31/05* (2014.01)
*H02S 50/10* (2014.01)
*H02J 3/38* (2006.01)

(56) References Cited

U.S. PATENT DOCUMENTS

| | | |
|---|---|---|
| 2006/0185727 A1 | 8/2006 | Matan |
| 2007/0103108 A1 | 5/2007 | Capp et al. |
| 2007/0236187 A1 | 10/2007 | Wai et al. |
| 2008/0143188 A1 | 6/2008 | Adest et al. |
| 2008/0150366 A1 | 6/2008 | Adest et al. |
| 2009/0078300 A1 | 3/2009 | Ang et al. |
| 2009/0206666 A1 | 8/2009 | Sella et al. |
| 2009/0217965 A1 | 9/2009 | Dougal et al. |
| 2010/0308660 A1* | 12/2010 | Willis .............. G05F 1/67 307/77 |
| 2011/0073150 A1* | 3/2011 | Hightower et al. .......... 136/244 |
| 2011/0285375 A1* | 11/2011 | Deboy .................. 323/299 |
| 2012/0193990 A1* | 8/2012 | Nimni et al. ............ 307/84 |
| 2012/0228947 A1* | 9/2012 | Noy .................... 307/80 |

OTHER PUBLICATIONS

A.J. Mahdi, W.H. Tang and Q.H. Wu, "Improvements of a MPPT Algorithm for PV Systems and Its Experimental Validation", International Conference on Renewable Energies and Power Quality ( ICREPQ 10) Granada (Spain), Dated Mar. 23-25, 2010, pp. 1-6.

Henry Shu-Hung Chung, K. K. Tse, S.Y. Ron Hui, C. M. Mok and M. T. Ho, "A Novel Maximum Power Point Tracking Technique for Solar Panels Using a SEPIC or Cuk Converter", IEEE Transactions on Power Electronics, Vol. 18, No. 3, Dated May 2003, pp. 717-724.

"Competition Electronics EasYMaX Solar Power Enhancer", www.solarfreaks.com/download/file.php?id=148, pp. 1-4.

Blue Sky Energy What is Maximum Power Point Tracking (MPPT) and How Does it Work?, www.blueskyenergyinc.com/uploads/pdf/BSE_What_is_MPPT.pdf, pp. 1-2.

\* cited by examiner

HARVESTING POWER FROM DC (DIRECT CURRENT) SOURCES

RELATED APPLICATIONS

The present application is related to and claims priority from co-pending India patent application entitled, "HARVESTING POWER FROM DC (DIRECT CURRENT) SOURCES", application serial number: 268/CHE/2011, filed on 28-Jan.-2011, naming as inventors Prakash Easwaran, Saumitra Singh, Rupak Ghayal and Amit Premy, and is incorporated in its entirety herewith.

BACKGROUND

1. Technical Field

Embodiments of the present disclosure relate generally to green technologies, and more specifically to harvesting power from DC sources such as solar panel arrays.

2. Related Art

Power is often harvested from various DC sources. DC sources provide output power with a fixed or constant polarity, as is well known in the relevant arts. Solar panels are examples of such DC sources.

A solar panel refers to a packaged assembly of photovoltaic cells, with each cell generally being designed to generate power from incident solar energy in the form of light. A single solar panel generally produces only a limited amount of power.

Hence, several solar panels are typically combined to form a solar panel array. Solar panels may be combined in series to generate a higher voltage output. Multiple series-connected solar panels may also be combined in parallel to enable a higher output current capability.

Power harvesting from solar panel arrays refers to techniques for drawing power generated by solar panels. The techniques may need to be designed to address several concerns, such as for example, the ability to draw the maximum power from each solar panel in a solar panel array, operational reliability of the panels, etc.

BRIEF DESCRIPTION OF THE VIEWS OF DRAWINGS

Example embodiments will be described with reference to the accompanying drawings briefly described below.

The drawing in which an element first appears is indicated by the leftmost digit(s) in the corresponding reference number.

DETAILED DESCRIPTION

1. Overview

Figure 1:
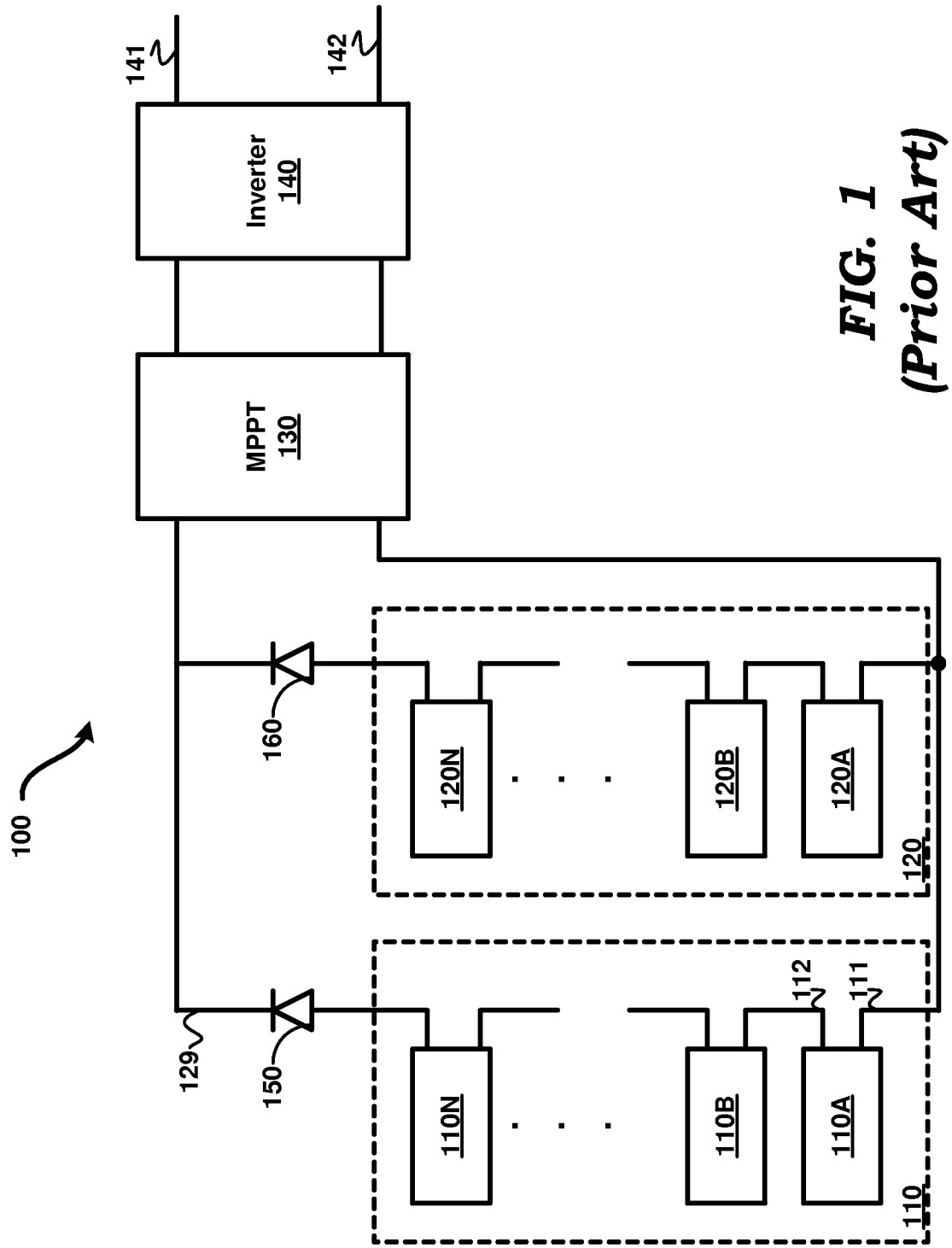
FIG. 1 is a block diagram of a prior power generation system that uses solar panel arrays.

According to an aspect of the present invention, a system for generating electric power includes a first set and a second set of photo-voltaic cells. The first set of photovoltaic cells is designed to provide a first voltage across a first node and a second node in response to incidence of light. The second set of photo-voltaic cells is designed to provide a second voltage across the second node and a third node, also in response to incidence of light. A first current source is coupled between the first node and the second node, and a second current source is coupled between the second node and the third node. The first set of photo-voltaic cells is provided in a first panel, and the second set of photo-voltaic cells are provided in a second panel. The first panel and the second panel are connected in series at the second node. Each of the first current source and the second current source generates a corresponding programmable current to cause the first panel and the second panel to operate at their respective maximum power point.

According to another aspect of the present invention, the system includes a third panel and a fourth panel respectively containing a third set of photo-voltaic cells and a fourth set of photovoltaic cells. The third panel and the fourth panel are connected in series. A voltage source is connected in series with the third panel and the fourth panel. The series combination of the voltage source, the third panel and the fourth panel is connected in parallel to the series combination of the first panel and the second panel between the first node and the third node. The voltage source is programmable to generate an output voltage to enable all panels in the first panels, second panel, third panel and the fourth panel to operate at their respective maximum power points.

According to yet another aspect of the present invention, each of the current sources and voltage sources deployed in the system is included in a corresponding control block. The control blocks operate automatically to determine the maximum operating points of the respective control panels, and adjust their current and/or voltage outputs to force the respective panels to operate at their maximum power points. In operating to determine the maximum power points of the respective panels, the control blocks communicate with each other. In an embodiment, each of the control blocks is designed to include a Bluetooth and/or ZigBee transceiver to facilitate such communication.

According to yet another aspect of the present invention, each of the control blocks is implemented to include a DC-DC converter, the DC-DC converter being designed to provide either a current source or a voltage source at its output. Each of the control blocks further includes a measurement block to perform measurements for determining the maximum power point of a panel.

Several features of the present invention will be clearer in comparison with a prior solar panel array and the corresponding prior approach is described below first.

2. Solar Panel Array

FIG. 1 is a block diagram of a prior power generation system that uses solar panel arrays. System 100 is shown containing solar panels 110A through 110N, 120A through 120N, diodes 150 and 160, maximum power point tracker (MPPT) 130 and inverter 140.

Panels 110A through 110N and 120A through 120N together represent a solar panel array. Each of the solar panels internally contains multiple photovoltaic cells connected to generate electric power in response to incident light. Thus, panel 110A generates an output voltage across terminals 111 and 112. Each of the other panels similarly generates an output voltage across the respective output terminals.

The output voltage generated by a panel is typically small (of the order of a few tens of volts), and therefore multiple panels may be connected in series to obtain a higher output voltage from the combination. In system 100, panels 110A through 110N (collectively referred to as string 110) are shown connected in series, and the resultant output voltage across terminals 129 and 111 is generally the sum of the output voltages of the individual panels 110A through 110N. Panels 120A through 120N are similarly shown connected in series, and collectively referred to as string 120.

The current that may be drawn from a single panel also being typically small, multiple series-connected solar panels may be connected in parallel to obtain a higher current. In system 100, strings 110 and 120 are shown connected in parallel.

Diodes 150 and 160 are respectively provided to prevent a reverse current from flowing through the panels. MPPT 130 is implemented to determine an optimum power point of operation for the solar panels, and to maintain the operation of the panels at an optimum power point. Inverter 140 converts the DC power output of the solar panel array into AC power, which is provided across terminals 141 and 142. Although not shown, the AC power may be distributed to consumers directly, or via a power distribution grid.

Figure 2:
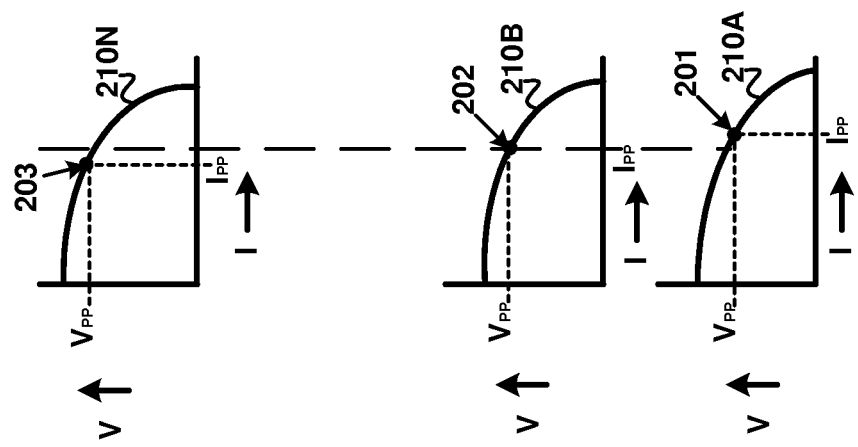
FIG. 2 is a graph showing a set of V-I curves of solar panels in a system.

A solar panel is typically associated with a maximum power point. The maximum power point (MPP) is an operating point of a solar panel at which maximum power is drawn from the panel, and corresponds to a voltage and current on a voltage-to-current (V-I) curve of the panel. FIG. 2 shows a set of V-I curves of some of the solar panels in system 100. Curves 210A, 210B and 210N respectively represent the V-I characteristics (well known in the relevant arts) of panels 110A, 110B and 110N. The voltage and current axes of the three curves are assumed to be represented on a same scale. The respective maximum power points of each of the three panels are denoted by points 201, 202 and 203 in the corresponding V-I curve. The voltage and current of each panel corresponding to the MPP is denoted as Vpp and Ipp respectively, and may be different from panel to panel. Vpp and Ipp are used herein to refer generically to the voltage and current respectively corresponding to the MPP of a panel, and may be referred as the 'peak voltage' and 'peak current' of the panel.

It may be observed from FIG. 2 that the MPPs of solar panels 110A, 110B and 110N are not all the same. The differences (or mismatch) in the MPPs may arise due to several reasons. Some of the reasons include mismatch arising from manufacturing tolerances, different levels of incident light energy on the solar panels, etc. In general, the MPPs of all the solar panels in panels 110 may not be the same. Similarly, the MPPs of all the solar panels in string 120 may not be the same. However, the current flowing through each of the solar panels in string 110 needs to have a same magnitude since the panels are connected in series. As a result, one or more of the panels in string 110 may be operational at a power point different from the corresponding MPP. Similarly, one or more of panels in string 120 may also be operational at a power point different from the corresponding MPP. Such operation is not generally desirable.

Strings 110 and 120 being connected in parallel, the sum of the voltage outputs of strings 110 and 120 is constrained to be equal. Again, any mismatch between the panels results in one or more of the panels not operating at its MPP. In general, the arrangement of multiple solar panels in a serially-connected string often results in one or more of the panels operating away from its MPP. Further, such operation away from MPP may occur even if only a single solar panel is present in a string.

Similarly, a parallel arrangement of multiple solar panels also often results in one or more of the panels operating away from its MPP. MPPT 130, typically is able to set an operating point only for the entire array (all shown strings) as a whole, and one or more panels may still operate at points that are different from the corresponding MPP of the panel.

Several features of the present invention address one or more of the disadvantages noted above. Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

3. Connection Topology for a Single String

Figure 3:
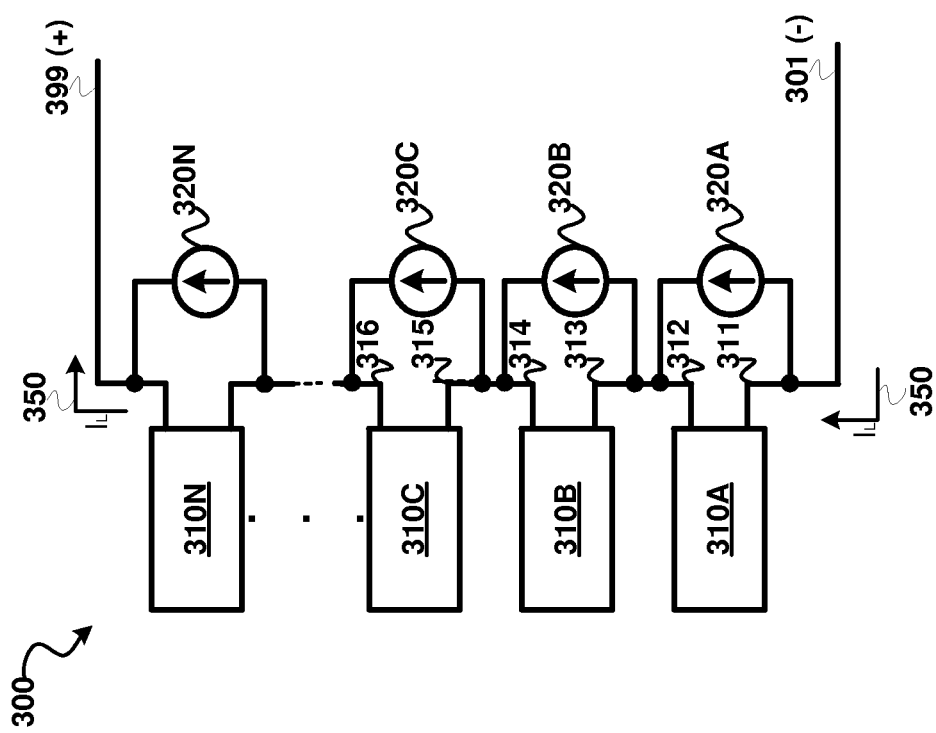
FIG. 3 is a block diagram illustrating the manner in which each solar panel in a series string of solar panels is operated at its maximum power point, in an embodiment of the present invention.

FIG. 3 is a diagram illustrating the manner in which each solar panel (example of a DC source) in a series string of solar panels is operated at its maximum power point, in an embodiment of the present invention.

Solar panel array 300 is shown containing a series string of solar panels formed by panels 310A through 310N. Current sources 320A through 320N are also shown in FIG. 3. As is well known in the relevant arts, a current source is generally a circuit that provides a constant current (source or sink) despite changes in voltage across a load through which the current is sourced or sunk.

A series string of solar panels refers to a solar panel array (such as array 300) in which the outputs of the solar panels are connected in series. Thus, the outputs of panels 310A through 310N of FIG. 3 are connected in series. To clarify, terminals 311 and 312 represent the output terminals of panel 310A, terminals 313 and 314 represent the output terminals of panel 310B, and terminals 315 and 316 represent the output terminals of panel 310C. Terminal 312 of panel 310A is connected to terminal 313 of panel 310B. Similarly, terminal 314 of panel 310B is connected to terminal 315 of panel 310C, and so on.

Terminals 399(+) and 301(−) are respectively the positive and negative terminals of DC power output from the solar panel array of FIG. 3. As shown in FIG. 3, each solar panel in a serially-connected string has a current source connected in parallel, i.e., across its output terminals. Thus, current source 320A is connected across the output terminals 311 and 312 of panel 310A. Similarly, current sources 320B and 320N are connected across the output terminals of panels 310B and 310N respectively. A corresponding current source is connected across the output terminals of each of the other panels also (not shown, but such as 310C, 310D, etc.) in the serially-connected string of panels of FIG. 3.

Each current source generates a current whose value is programmable, the current being generated to flow in the direction of current-draw from the serial-connected string of panels. The direction of current flow of load current $I_L$ through the panels of FIG. 3 is indicated in FIG. 3 by arrows 350. The direction of current generated by each current source is indicated by the current-source symbols. The value of current generated by each current source is determined based on the maximum power point (MPP) of the corresponding panel and the load current ($I_L$) drawn from array 300 by a load (or loads) connected across terminals 399(+) and 301(−).

In an embodiment described below, the current generated by a current source is set to a value equaling the difference between load current ($I_L$) and the current corresponding to the MPP of the panel. To illustrate, if load current ($I_L$) equals 5A, and the current (Ipp) corresponding to the MPP of panel 310A is 4.5 A, then current source 320A is programmed to generate a current equal to 0.5 A, being the difference of load current ($I_L$) and Ipp (or specifically $I_L$−Ipp). Similarly, assuming the current corresponding to the MPP of panel 310B is 5 A, then current source 320B is programmed to generate 0 A, i.e., no current. Each of the other current sources is programmed correspondingly.

Thus, a current source 'diverts' an 'excess current' equal to the difference of $I_L$ and Ipp of the panel across which it is connected, thereby maintaining the current through the panel at its Ipp, and therefore at its MPP. As a result, maximum power is extracted from each of panels 310A through 310N, and provided as output DC-DC converter power across terminals 399(+) and 301(−).

While a series-connection of multiple solar panels is shown in FIG. 3, the description with respect to FIG. 3 also applies when only a single solar panel is present. For example, assuming that only a single panel 310A is connected across terminals 399(+) and 301(−), then (only) current source 320A would be present and connected across terminals 312 and 311. The current output of current source 320A would be set to the difference of the load current and the current corresponding to the MPP of panel 310A.

Extension of the technique of above to multiple parallely-connected strings may require further extensions, as described below with additional examples.

4. Connection Topology for Multiple Parallely-Connected Strings

Figure 4:
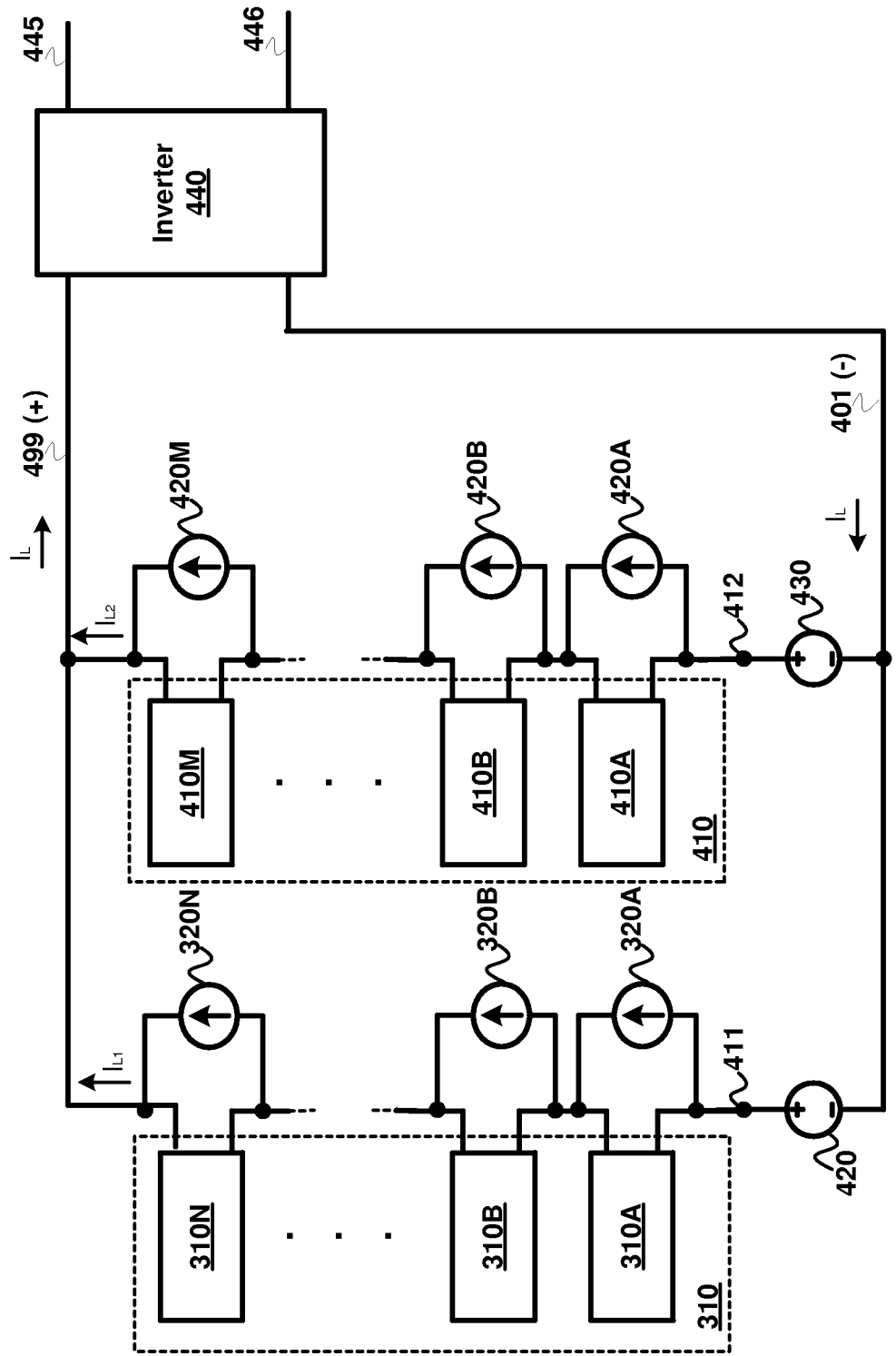
FIG. 4 is a block diagram illustrating the manner in which multiple serial strings of solar panels are deployed in an embodiment of the present invention.

FIG. 4 is a diagram illustrating the manner in which each solar panel contained in multiple parallely-connected strings of solar panels is operated at its maximum power point, in an embodiment of the present invention. As shown in FIG. 4, when two or more serial strings of solar panels are connected in parallel, a programmable voltage source is connected in series with each serially-connected string of solar panels. In FIG. 4, panels 310A through 310N form one serially-connected string, referred to herein as string 310. Panels 410A through 410M form a second serially-connected string, referred to herein as string 410. As is well known in the relevant arts, a voltage source is generally a circuit that generates a constant voltage despite changes in the value of a load current drawn from the voltage source. Although the term 'voltage source' is used herein, in general the term 'power source' may also be used to describe such a voltage source.

String 310 and string 410 are connected in parallel to enable higher current output. Thus, $I_L$ of FIG. 4 is the sum of $I_{L1}$ (through string 310) and $I_{L2}$ (through string 410). Terminals 499 (+) and 401 (−) represent the DC output terminals of the solar panel array of FIG. 4. Inverter 440 converts DC power received on paths 499(+)/401(−), and generates AC power on paths 455/456. Terminals 455/456 may be connected to a power grid, or be used to power loads not connected to a power grid. Inverter 440 may be implemented in a known way.

Programmable voltage source 420 is shown connected in series with string 310, and programmable voltage source 430 is shown connected in series with string 410. The number M of solar panels in string 410 may be equal to or different from the number N of solar panels in string 310. If voltage sources 420 and 430 were not connected, and instead if nodes 411 and 412 were directly connected to node 401, the requirement of both the voltages across string 310 and string 410 having to be equal may result in one or more solar panels in string 310 and 410 operating at points different from its corresponding MPP. Such operation at points different from the corresponding MPP may result even if M equals N, i.e., even when the number of solar panels in each of string 310 and string 410 are equal. As noted above, this may occur due to mismatches between the individual solar panels, different levels of incident light falling on the solar panels, etc.

The connection of voltage sources 420 and 430 enables operation of solar panels at their respective MPPs when multiple serially-connected strings are connected in parallel. The magnitude of the voltage output of one or both of voltage sources 420 and 430 is set to a value to enable each solar panel of FIG. 4 to operate at its MPP, when strings are paralleled.

To illustrate, assume that the sum of the voltages of panels in string 310 when each of the panels in string 310 is operated at its MPP is V1 volts. Assume also that the sum of the voltages of panels in string 410 when each of the panels in string 410 is operated at its MPP is V2 volts. Under the above assumptions, paralleling of strings 310 and 410 will force at least one of the panels in the strings to deviate from its MPP. Specifically, the voltage output of at least one panel will be different from the voltage corresponding to its MPP, thereby resulting in less-than-maximum power-draw from that panel.

However, when connected as in FIG. 4, and assuming V2 is greater than V1, voltage source 430 is set to 0V and voltage source 420 is set to generate (V2−V1) volts, thereby allowing each panel to operate at its MPP. On the other hand, if V1 is greater than V2, voltage source 420 is set to 0V and voltage source 420 is set to generate (V2−V1) volts. If V1 equals V2, then each of voltage sources 420 and 430 is set to 0 volts.

While FIG. 4 is shown containing only two parallel strings, any number of strings can be formed in parallel, with corresponding voltage sources set to generate voltages to enable the voltage across each parallel string (with each of the constituent solar panels operating at its respective MPPs) to be equal. In addition, although the parallely-connected strings (e.g., string 310 and string 410) are described as containing multiple solar panels each, in other embodiments, each of the parallely-connected string may contain only one solar panel. In such embodiments also, a voltage source is connected in series with each of the parallely-connected solar panels, with the voltage sources operated in a manner similar to that described above.

Further, although, a current source is shown coupled across the output terminals of each of the solar panels 310A-310N and 410A-410N, in an alternative embodiment, the current sources are not provided or connected, and only voltage sources 420 and 430 are provided as shown.

Further still, while the techniques described herein refer to solar panels, the techniques can be extended to cover any type of DC power source in general. Thus, for example, one or more solar panels of FIG. 4 can be replaced by other types of DC power sources, including batteries, fuel cells, etc.

Although a solar panel and the associated current source are shown and referred to separately, in some embodiments a solar panel and current source (e.g., panel 310A and current source 320A) can be packaged as a single assembly. Hence, the combination of a solar panel and a current source packaged in single assembly is also referred to herein as a solar panel.

In an embodiment, the current sources and voltage sources of FIG. 4 are provided within corresponding control blocks, as described in detail below with examples.

5. Implementation

Figure 5:
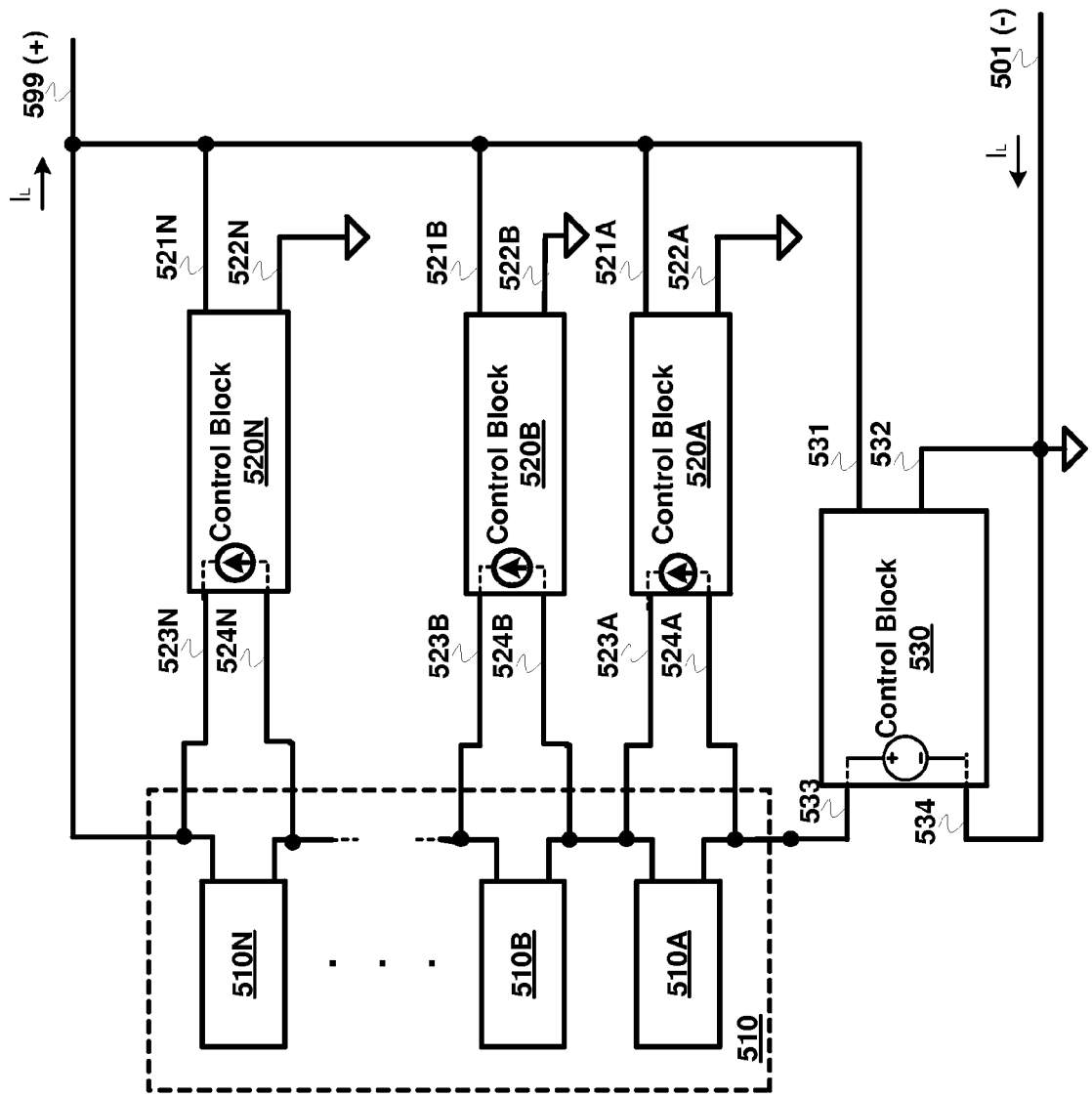
FIG. 5 is a block diagram illustrating the manner in which control blocks are connected to enable operation of solar panels at their maximum power point, in an embodiment of the present invention.

FIG. 5 is a block diagram illustrating an array of serially-connected solar panels with corresponding connections to respective control blocks that provide (and control the magnitudes of) the current sources and voltage sources connected to the panels in the array. Solar panels 510A through 510N are shown connected in series. Serially-connected panels 510A through 510N are referred to as string 510. For ease of description only one-serially connected string of solar panels is shown with the corresponding DC-DC converters. However, multiple-serially connected strings may be connected as shown in FIG. 4. Terminals 599(+) and 501(−) respectively represent the positive and negative DC power output terminals of the solar array of FIG. 5. Although not shown in FIG. 5, terminals 599(+) and 501(−) may be connected to an inverter for conversion of the output power from DC to AC.

Control blocks 520A through 520N provide the respective current sources across the output terminals of respective panels 510A through 510N. The current source provided by each control block is indicated in FIG. 5 by a current source symbol. Control block 530 provides a voltage source in series with serial string 510.

Terminals 521N and 522N represent the power input terminals of control block 520N, and receive input power from an input DC power source. In the embodiment shown in FIG. 5, control block 520N receives input DC power from DC power output terminals 599(+)/501(−) of string 510 itself. Similarly each of the other control blocks also receives input power from DC power output 599(+)/501(−). Terminal-pair 521B/522B represents the input terminals of control block 520B, and terminal-pair 521A/522A represents the input terminals of control block 520A. Control block 520N provides a current source across output terminals 523N and 524N. Similarly, control blocks 520B and 520A respectively provide a current source across respective output terminal-pairs 523B/524B and 523A/524A. The other control blocks (such as 510C, 510D, etc) not shown in FIG. 5 also provide respective current sources across the corresponding panel.

Terminal-pairs 531/532 and 533/534 respectively represent the input and output terminals of control block 530. Control block 530 provides a voltage source across output terminals 533 and 534, the voltage source being connected in series with string 510.

Each of control blocks 520A through 520N is designed to enable determination of the maximum power point (MPP) of the corresponding panel to which it is connected in parallel, as described in detail in sections below. Thus, control block 520N is designed to determine the MPP of panel 510N, control block 520B is designed to determine the MPP of panel 510B, and so on.

Control block 530 receives information from each of control blocks 520A through 520N, with the information specifying the Vpp of each of the corresponding panels. Control block 530 may also receive data specifying the sum of the Vpps of panels in each of other series-connected strings (not shown, but similar to string 410 of FIG. 4) from other control blocks implemented to provide a voltage source in series with the respective series-connected strings. Based on the information received, control block 530 sets its output voltage (i.e., across terminals 533 and 534) to a value that is determined as noted above. The communication between the control blocks may be effected by any one of several well-known techniques. In an embodiment, each control block contains a Bluetooth/ZigBee transceiver that enables such communication. However, other techniques may be employed in other embodiments, as will be apparent to one skilled in the relevant arts on reading the disclosure provided herein.

Although in FIG. 5, each control block is shown as receiving input power from DC power output 599(+)/501(−), in other embodiments, one or more separate DC power sources not connected to (or derived from) terminals 599(+)/599(−) may be used instead. Powering each of the control blocks directly from output 599(+)/501(−) may render the design of the control blocks complex and expensive, since the control blocks may need to be designed to handle higher input operating voltages. Output voltage 599/501 is typically around 600V-1000V depending on the specific number of panels in string 510.

Figure 6:
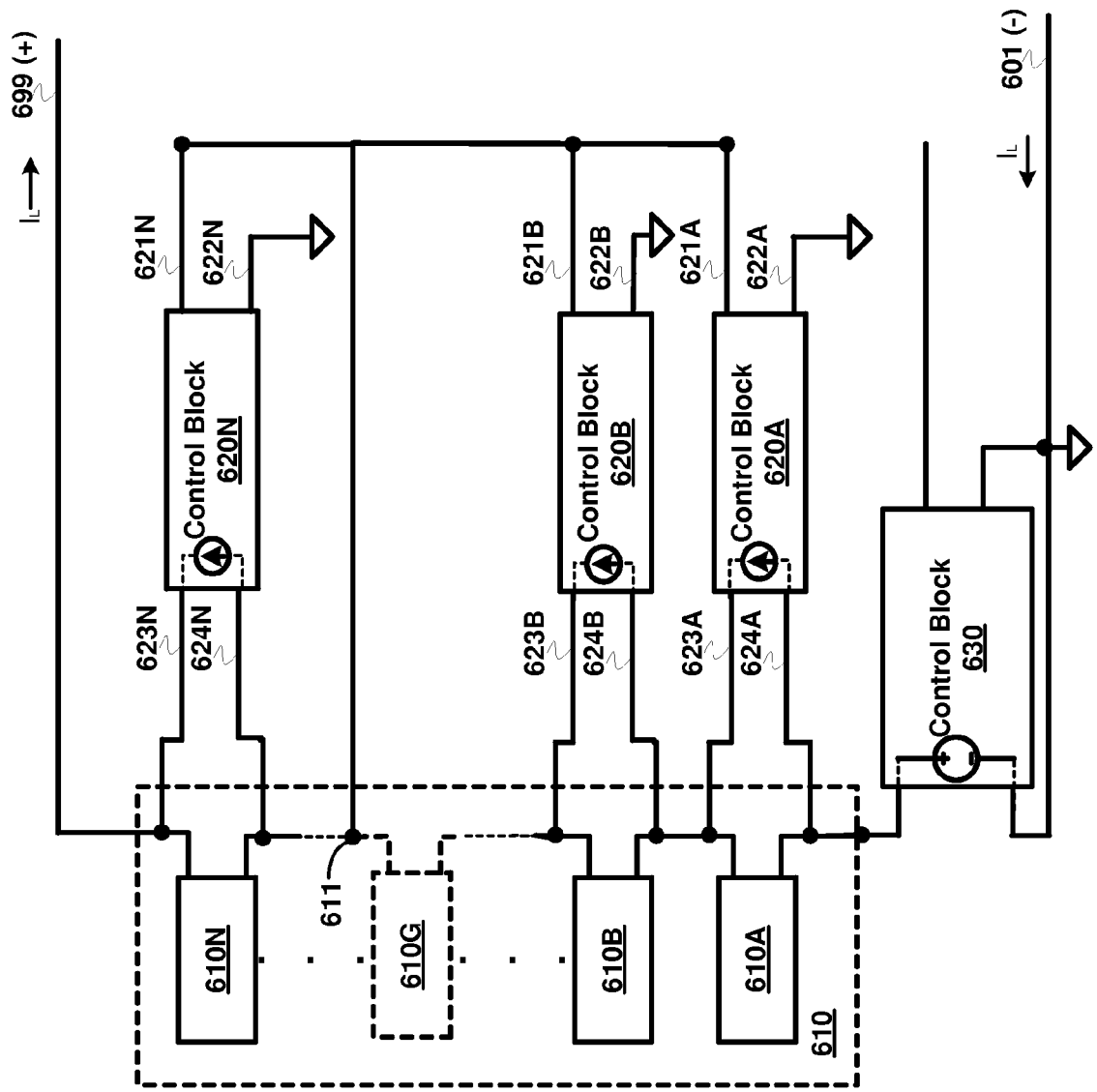
FIG. 6 is a block diagram illustrating the manner in which control blocks are connected to enable operation of solar panels at their maximum power point, in an alternative embodiment of the present invention.

FIG. 6 is a diagram illustrating the details of another embodiment, in which control blocks are powered by a relatively smaller input voltage (compared to that in FIG. 5). Terminals 621N, 622N, 623N, 624N, 621B, 622B, 623B, 624B, 621A, 622A, 623A, and 624A correspond respectively to terminals 521N, 522N, 523N, 524N, 521B, 522B, 523B, 524B, 521A, 522A, 523A, and 524A of FIG. 5. Panels 610A through 610N, control blocks 620A through 620N, and control block 630, as well as the connections shown in FIG. 6 are identical to those of FIG. 5, except that each of the control blocks is powered from an intermediate tap (node 611) in string 510. Power-tap node 611 in FIG. 6 is shown as being at the output node of an intermediate solar panel 510G in string 510. However, the specific tap-point corresponding to node 611 may be selected based on the desired value of input DC voltage to be used for powering the control blocks. The voltage at node 611 is less than that at 599(+). The control block corresponding to panel 510G is not shown in FIG. 6.

Figure 7:
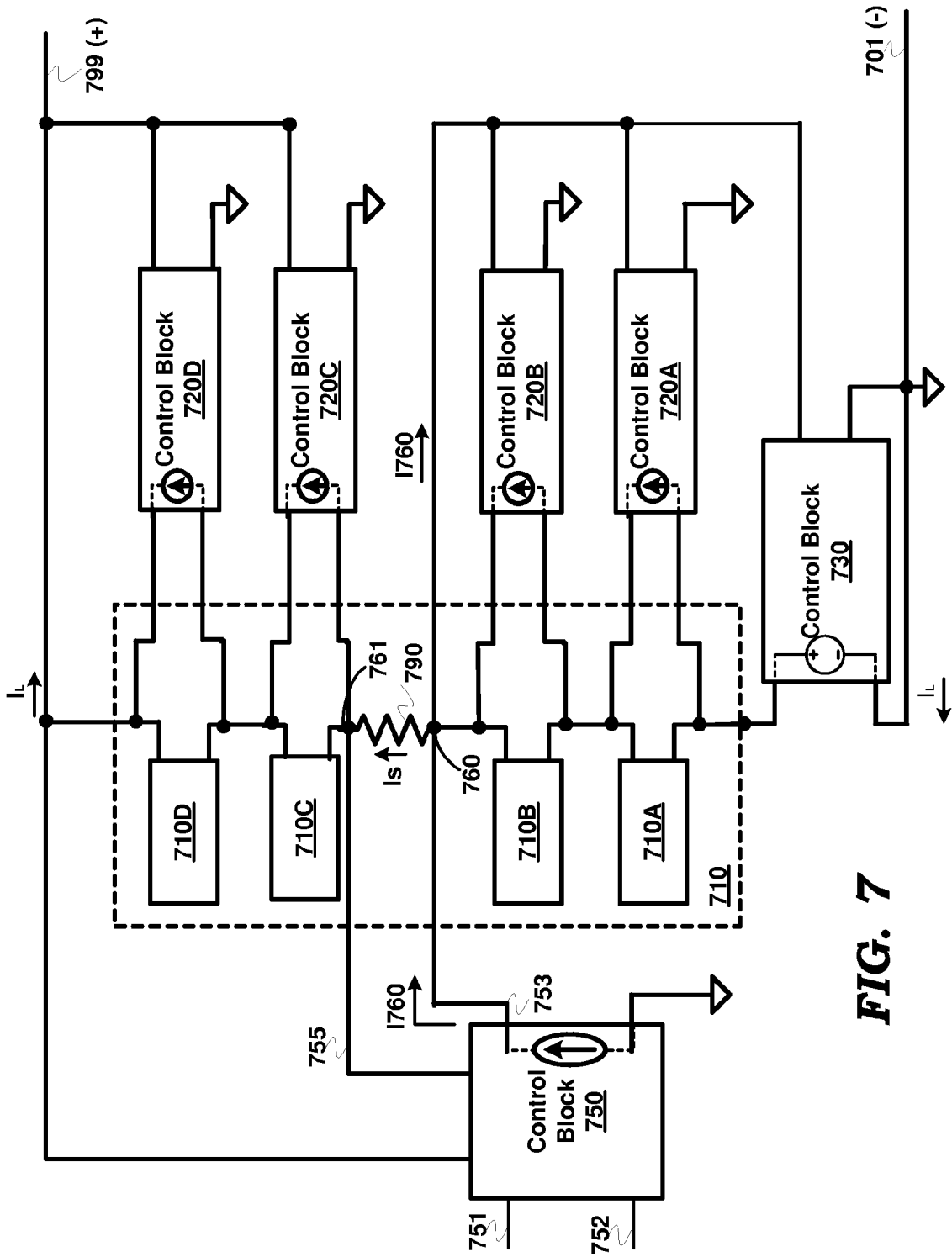
FIG. 7 is a block diagram illustrating the manner in which control blocks are connected to enable operation of solar panels at their maximum power point, in yet another embodiment of the present invention.

In yet another embodiment, some of the control blocks are powered directly from node 599(+), while other control blocks are powered from an intermediate power tap point such as node 611 of FIG. 6. FIG. 7 is a diagram illustrating the details of such an embodiment.

In FIG. 7, only four panels 710A through 710D (collectively referred to as string 710) are shown for ease of description. Each of control blocks 720A through 720D operates to provide a current source across the output terminals of the respective panels, as described above. Control block 730 operates identical to control block 530 of FIG. 5. Input power to control blocks 720D and 720C is provided from DC power output terminal 799 (+), while input power to control blocks 720B and 720A is provided from node 760.

Control blocks 720A, 720B and 730 together draw a current (1760) from node 760, the value of current 1760 equaling the sum of the currents provided as output by control blocks 720A and 720B and 730 combined (assuming 100% efficiency in each of control blocks 720A, 720B and 730). As a result the current (Is) flowing through the series connection of panels 710D and 710C becomes less than the current flowing through the series combination of panels 710A and 710B, thereby resulting in one or more of the panels operating at a point different from the corresponding MPP despite the operation of the current sources and the voltage source. In the embodiment of FIG. 7, control block 750 forces a current equal in magnitude to 1760 into node 760 to nullify the reduction in (Is) by the magnitude equaling 1760.

Control block 750 receives input power across input terminals 751 and 752. The input power across input terminals 751 and 752 may be provided from the DC power output 799(+)/701(−), any intermediate tap point in string 710, or be received from a DC source, not connected to any of the outputs of panels in string 710. When input power is provided from an intermediate tap point in string 710, a correction (e.g., by adding a current source) similar to that provided by control block 750 due to powering of control blocks 720A and 720B from node 760 may need to be provided.

Control block 750 may determine the magnitude of current (1760) to be generated by the current source provided in control block 750 in a manner similar to that determined by any of the control blocks operating to provide corresponding current sources, and as described in detail below. Thus, the addition of a current source provided by control block 750 enables an intermediate point such as point 760 to power some of the control blocks used in FIG. 7, while other control blocks are powered by terminals 799(+).

Depending on the specific power input connection to the control blocks, additional current sources such as provided by control block 750 may be connected across the corresponding terminals of string 710 in a similar manner.

The manner in which the magnitude of a current to be set in a current source and the determination of MPP of a solar panel is performed is described next.

6. Determination of the Magnitude of Current to be Set in a Current Source

Techniques for determination of the magnitude of current to be set in a current source and the determination of MPP of a solar panel are described with reference to corresponding flowcharts below. Each of the flowcharts below is described with respect to a control block connected across a panel merely for illustration. However, various features described herein can be implemented in other devices and/or environments and using other components, as will be apparent to one skilled in the relevant arts by reading the disclosure provided herein. Further, the steps in the flowcharts are described in a specific sequence merely for illustration. Alternative embodiments using a different sequence of steps can also be implemented without departing from the scope and spirit of several aspects of the present disclosure, as will be apparent to one skilled in the relevant arts by reading the disclosure provided herein.

Figure 8A:
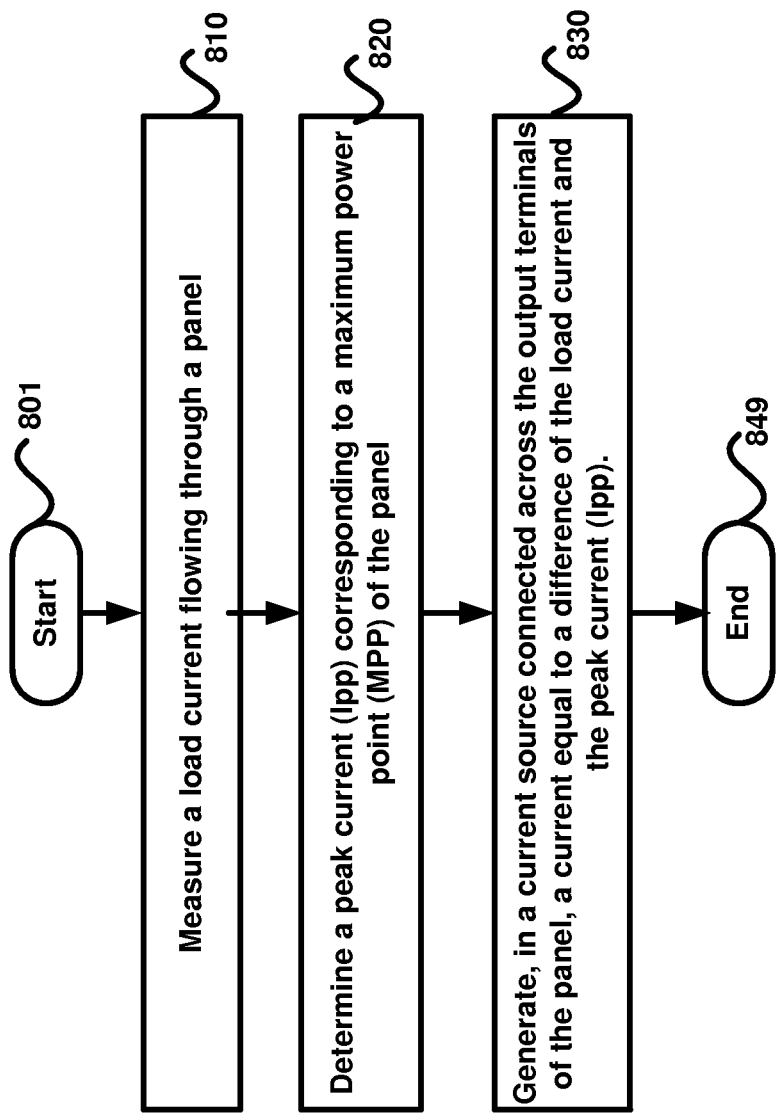
FIG. 8A is a flowchart illustrating the manner in which a control block connected across the output terminals of a solar panel determines the magnitude of current to be set, in an embodiment of the present invention.

FIG. 8A is a flowchart illustrating the manner in which a control block connected across the output terminals of a solar panel determines the magnitude of current to be set, in an embodiment of the present invention. The flowchart starts in step 801, in which control immediately passed to step 810.

In step 810, a control block measures a load current flowing through a panel across the terminals of which the control block is connected. Control then passes to step 820.

In step 820, the control block determines a peak current (Ipp) corresponding to a maximum power point (MPP) of the panel. Control then passes to step 830.

In step 830, the control block generates an output current equal to a difference of the load current and the peak current (Ipp). The output current is generated in the current source provided across the output terminals of the control block. Control then passes to step 849, in which the flowchart ends.

The manner in which the determination of the peak current (Ipp) is performed in an embodiment of the present invention is illustrated below.

7. Determination of Peak Current and MPP

Figure 8B:
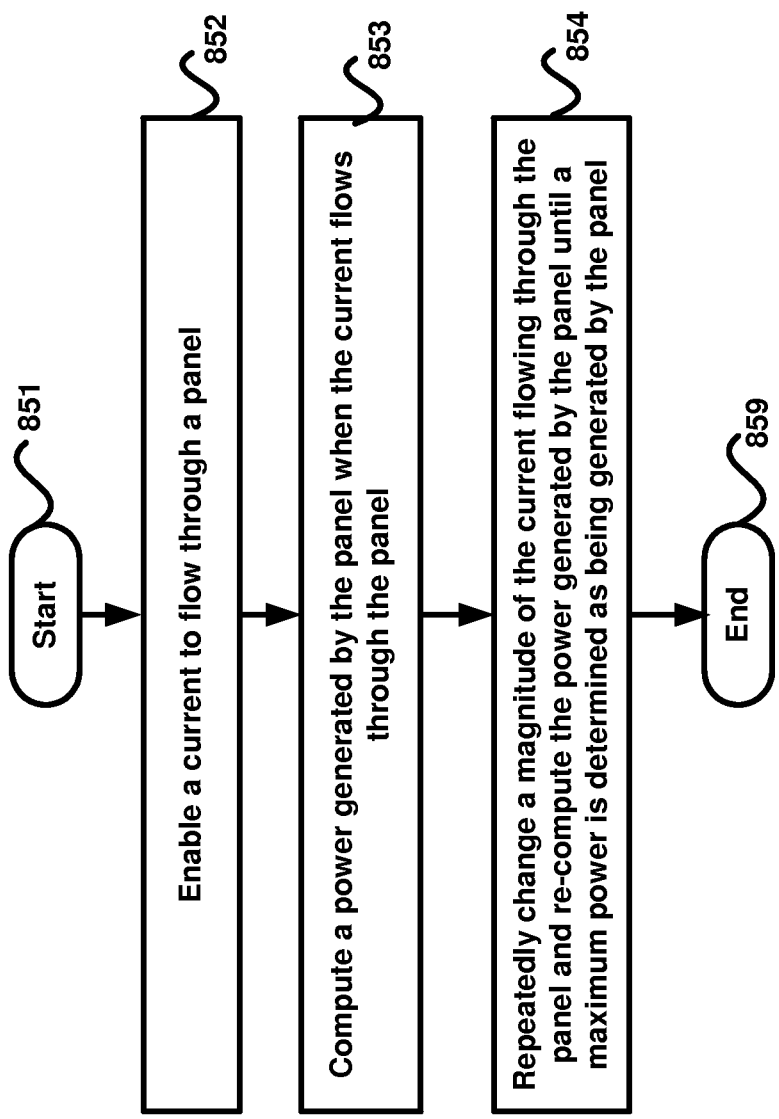
FIG. 8B is a flowchart illustrating the manner in which the peak current (Ipp) and the maximum power point (MPP) of a panel are determined, in an embodiment of the present invention.

FIG. 8B is a flowchart illustrating the manner in which the peak current (Ipp) and the maximum power point (MPP) of a panel are determined in an embodiment of the present invention. The flowchart starts in step 851, in which control immediately passed to step 852.

In step 852, a control block enables a current to flow through a panel. The magnitude of the current flowing through the panel may be set by the control block by suitably setting the value of the current output of a current source provided by the panel. Control then passes to step 853.

In step 853, the control block computes the power generated by the panel when the current (set in step 852) flows through the panel. Control then passes to step 854.

In step 854, the control panel repeatedly changes the magnitude of the current flowing through the panel and re-computes the power generated by the panel until a maximum power is determined as being generated by the panel. The maximum power corresponds to the maximum power point (MPP) and the peak current (Ipp) of the panel. Control then passes to step 859, in which the flowchart ends.

Thus, the control panel computes the power generated by the panel corresponding to each of multiple settings of the current magnitude flowing through the panel. The range of settings of the current magnitude is wide enough to ensure that the MPP is determined correctly. The change in the magnitude of current through the panel between successive iterations may be chosen to minimize the total number of iterations needed to determine the Ipp. The specific manner in which the magnitude of the current through the panel is changed (step 854) may be from zero to load current in increasing magnitudes, from load current to zero in decreasing magnitudes, random or in a binary weighted fashion, etc.

Figure 8C:
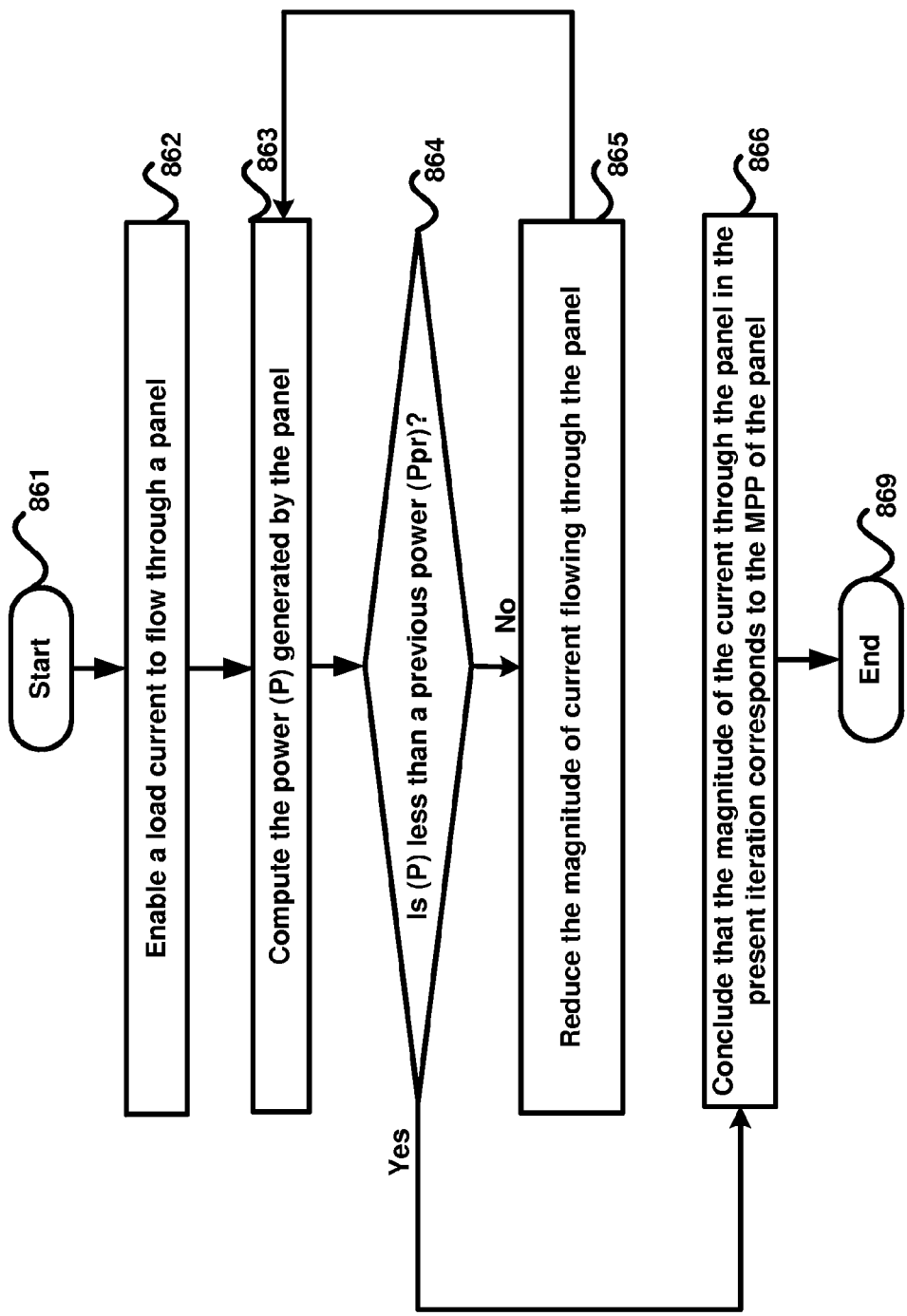
FIG. 8C is a flowchart illustrating the manner in which the peak current (Ipp) is determined in another embodiment of the present invention.

FIG. 8C is a flowchart illustrating the manner in which the peak current Ipp is determined by first setting the current through a panel to equal the load current of the series-connected string in which the panel is connected, and then reducing the current through the panel till the MPP and Ipp are determined. The flowchart starts in step 861, in which control immediately passed to step 862.

In step 862, a control block enables a load current ($I_L$) to flow through a panel. The control block accordingly sets the current output of a current source provided in the control block to zero, the current source generating the current output to be parallel to the current flowing through the panel. Control then passes to step 863.

In step 863, the control block computes the power (P) generated by the panel. The power (P) equals the product of the voltage across the panel and the current flowing through the panel. Control then passes to step 864.

In step 864, the control block determines if the power (P) less than a power (Ppr) computed in an immediately previous iteration of the steps of the flowchart of FIG. 8C. If (P) is less than (Ppr), control passes to step 866. However, if (P) is greater than (Ppr), control passes to step 865.

In step 865, the control block reduces the magnitude of current flowing through the panel. In an embodiment of the present invention, the control block reduces the magnitude by increasing the current output of the current source provided in the control block. Control then passes to step 863.

In step 866, the control block concludes that the current in the present iteration is the peak current (Ipp) corresponds to the MPP of the panel. Control then passes to step 869, in which the flowchart ends.

Corresponding to the peak current (Ipp), the control block measures the peak voltage (Vpp) of the panel also. Having determined Ipp of the panel, the control block sets the current source to generate a current equal to the difference of the load current and Ipp. It is noted here that the operations of the flowchart of FIGS. 8B and 8C are performed 'on-line', i.e., with a solar panel array connected to a load, and with a load current being drawn from the solar panel array. There is, thus, no requirement to remove the panels from the array or disconnecting the array from the load for making the MPP determination.

Figure 9A:
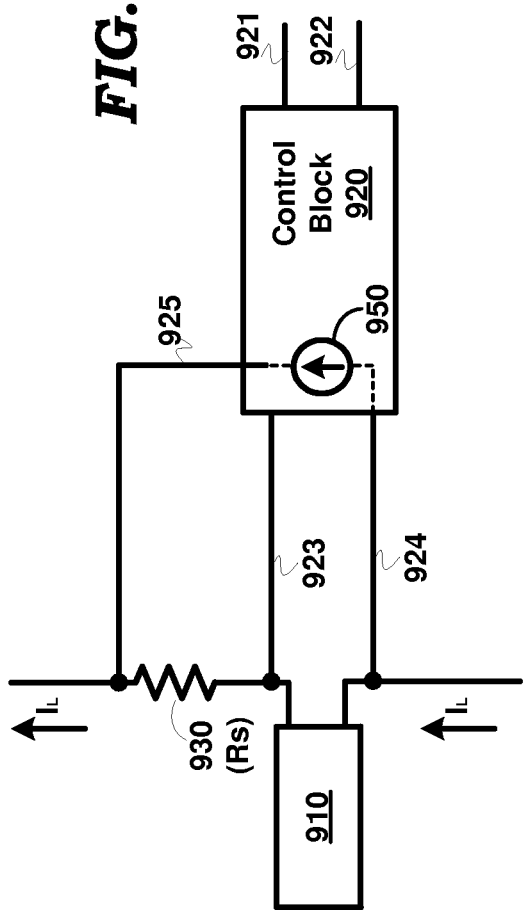
FIG. 9A is a block diagram used to illustrate the manner in which a control block determines the maximum power point of a solar panel.
Figure 9B:
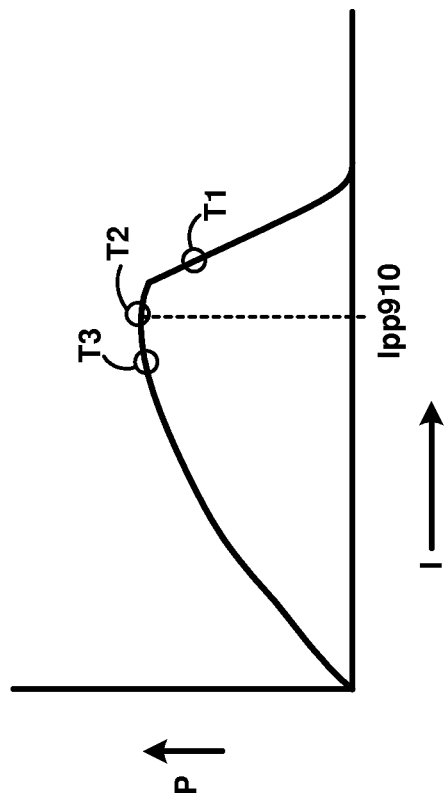
FIG. 9B is a power-current graph of a solar panel.

FIG. 9A and FIG. 9B are diagrams used to further illustrate the operations of the steps of the flowcharts described above with respect to FIGS. 8A, 8B and 8C. FIG. 9A shows solar panel 910, control block 920 and sense resistor (Rs) 930. Terminals 921 and 922 represent the input terminals of control block 920 and receive DC input power, not shown, but in a manner similar to that described above with respect to FIG. 5, 6 or 7. Terminals 924 and 925 represent the output terminals of control block 920. Terminal 923 represents an input terminal of control block 920. Control block 920 provides a current source across terminals 925 and 924, and the current generated by the current source will be referred to below as current 950.

It is noted here that although not shown in any of FIGS. 4, 5, 6 and 7, each solar panel is associated with a sense resistor, which is connected in series with the output of the corresponding solar panel. When the solar array is operational, load current $I_L$ flows through a sense resistor and the voltage drop across the sense resistor provides a measure of $I_L$.

To determine the MPP of panel 910, control block 920 initially sets current 950 to 0 A (0 Amperes). With current 950 set to 0 A, load current $I_L$ equals the current (Ipanel) flowing through panel 910. Control block 920 measures the voltage drop across sense resistor 930 (Rs). The voltage drop across Rs is measured via terminals 925 and 923. Control block 920 divides the voltage drop by Rs (resistance Rs has a predetermined value) to obtain the value of Ipanel. Control block 920 also measures the voltage drop across terminals 923 and 924, which equals the voltage output Vp of panel 910. Control block obtains the product of Ipanel and Vp to compute the operating power point of panel 910. The product (Ipanel*Vp), thus obtained, corresponds to a setting of 0 A of current 950.

Control block 920 then increments current 950 to a value I1. The specific value by which current 950 is incremented may be selected based on the accuracy with which the MPP of panel 910 is to be determined, and the resolution of current source 950. With current source 950 set to I1, the current (Ipanel) through panel 910 equals the difference of $I_L$ and I1. Control block 920 again computes the product of the voltage across terminals 923 and 924 and the current through panel 910 (equal to $I_L$-I1) to determine the power output of panel 910. Depending on whether the computed power is less than or greater than the power corresponding to current 950 being zero, control block 920 either increases or decreases I1 prior to the next iteration of measurement.

FIG. 9B is a graph showing the variations in power (P) generated by panel 910 with respect to output current (I) of panel 910. The graph shown in FIG. 9B is similar to the V-I curves of FIG. 2, except that power (instead of voltage) is shown along the y axis. Assume, for illustration, that operating point T1 corresponds to the power (generated by panel 910) measured by control block 920 when current 950 is 0 A. Control block 920 increases current 950 to a non-zero value as noted above for the next iteration, in which current 950 is I1. Assuming that operating point T2 represents the power measured by control block 920 for the iteration, it may be observed that the power generated by panel 910 corresponding to T2 is greater than that at T1.

In a next iteration, control block 920 further increases current 950, thereby further reducing the current (Ipanel) through panel 910. Assume that T3 represents the power corresponding to the iteration. It may be observed that power corresponding to T3 is lesser than that corresponding to T2. Therefore, control block 920 concludes that T2 represents the maximum power point (MPP) of panel 910. Ipp910 represents the current at MPP T2, and is thus the peak current Ipp. The voltage corresponding to point T2 is the peak voltage Vpp. Thus, by measuring the power generated by panel 910 for various settings of current 950, control block 920 is able to determine the MPP of panel 920. Control block 920, thus, obtains the value of the peak current Ipp910 corresponding to the MPP of panel 910. With the combined knowledge of Ipp910 and the value of $I_L$, control block 920 sets the value of current 950 to a value equal to ($I_L$-Ipp910), thereby ensuring that panel 910 operates at its MPP.

It is noted here that, in an alternative embodiment, current source 950 may be connected across terminals 923 and 924. In such an embodiment, control block 920 needs to measure the voltage across sense resistor 930 once initially (with magnitude of current 950 set to 0 A) to determine the load current $I_L$. Control block 920 then iteratively reduces the magnitude of the current (Ipanel) flowing through panel 910 by correspondingly increasing the magnitude of current 950 in each iteration. The value of Ipanel in each iteration being the difference of $I_L$ and current 950 for that iteration, control block computes the power output of panel 910 as the product of the difference and the voltage across panel 910. Control block 920 determines the MPP of panel 910 in a manner similar to that described above. In such an embodiment, only one sense resistor may be provided. The control block which measures $I_L$ by reading the voltage drop across the sense resistor may be designed to communicate the magnitude of $I_L$ to other control blocks in the array.

The magnitude of load current $I_L$ may vary with time. The operating conditions of panel 910 may also vary with time. For example, the level of incident light on panel 910 may vary with the time of the day or due to clouds or other factors. As a result Ipp910 may also vary with time. Therefore, control block may repeat the determination of MPP of panel 910 at regular intervals, for example, once every ten seconds.

In a manner similar to that described above, each 'current-source' control block (i.e., a control block that is designed to provide a current output, such as control blocks 520A-520N of FIG. 5) in a solar panel array implemented according to the present invention determines the MPP of the panel across which it is connected. Thus, with reference to FIG. 5 for example, each of control blocks 520A through 520N determines the MPP of respective panels 510A through 510N. Assuming multiple serially-connected strings are connected in parallel, each of the corresponding additional control blocks operating to provide current sources determines the MPP of the respective panel to which it is connected. Thus, each current-source control block determines both the Ipp value (i.e., the magnitude of current corresponding to the MPP of the panel) of the panel across which it is connected, as well as the value of $I_L$ flowing through the serial string of panels of which it is a part, and thereby determines the value of current it needs to generate.

In an embodiment, control block 750 of FIG. 7 determines the magnitude of current 1760 in a manner similar to that described above with respect to FIG. 8B. In the example of FIG. 7, the combination of panels 710D and 710C is referred to as Pa1, and the combination of panels 710B and 710A as Pa2. Control block 750 initially sets the magnitude of output current of the current source provided in control block 750 to 0 A. Control block 750 measures the voltage drop across sense resistor 790 via terminals 753 and 755 to obtain the value of current Is. Control block 750 measures the corresponding voltage drop across nodes 799(+) and 761. The product of Is and the voltage drop across nodes 799(+) and 761 provides the power output of Pa1. Control block 750 then increases the current output of the current source in control block 750, and repeats the measurement of Is and the voltage across 799(+) and 761 till the computed power across Pa1 is a maximum. Control block 750 sets the magnitude of the current of the current source in control block 750 to the value corresponding to the maximum power across Pa1. The specific technique employed by control block 750 to determine the required magnitude of output current of its current source is provided merely by way of illustration, and other techniques will also be apparent to one skilled in the relevant arts upon reading the disclosure herein.

Referring again to FIG. 8B, for correct determination of Ipp of a panel in a serially-connected string of panels, the technique described above requires that $I_L$ associated with the string be larger than the largest-valued Ipp among the Ipps of panels in the string. Thus, with reference to FIG. 5, for example, the value of $I_L$ needs to be larger than the largest Ipp among Ipps of panels 510A through 510N. When $I_L$ is smaller than 'N' number of Ipps of panels in a serial string, then according to the MPP determination algorithm described above, N of the current source control blocks would have determined that the required output current setting is 0 A, which may be erroneous. The reason for the possible erroneous determination of the required output current setting is that a current source control block can only reduce (but cannot add to) the current flowing through the associated panel.

According to an aspect of the present invention, the voltage-source control block (i.e., the control block that is designed to provide a voltage output, such as control block 530 of FIG. 5) in a serial string of panels communicates with all the current-source control blocks in the string to obtain information specifying which of the current-source control blocks has determined that its output current should be set to 0 A. Thus, with respect to FIG. 5, each of current-source control blocks 520A through 520N provides to voltage source control block 530 data specifying if its output current was determined as required to be set to zero. If the output current of one or more of the current source control blocks was determined as 0 A, the voltage source control block increases the current drawn from its input power source, thereby increasing the value of $I_L$. Thus, for example, with respect to FIG. 5, voltage source control block 530 increases its output current on path 533 to 534, thereby increasing $I_L$.

After the voltage source control block increases its output current (by a predetermined magnitude), each of the current-source control blocks again determines the MPP and the value of Ipp of its associated panel. Each of the current source control blocks then communicates to the voltage source control block whether the determined value of the Ipp of the associated panel is 0 A. If any of the re-determined Ipps is 0 A, the voltage source control block further increases the value of $I_L$. The determining of the Ipps and increasing of $I_L$ is repeated till none of the determined Ipps equals 0 A. Thus, the algorithm ensures correct determination of MPP of a solar panel. Voltage source control block 530 may be viewed as effectively 'setting' the magnitude of load current drawn from string 510.

A voltage source control block may be used to set the magnitude of current flowing through a series-connected string. Referring to FIG. 3, although a voltage source is not shown there in the interest of clarity, in practice a voltage source is connected in series with panels 310A-310N. The corresponding voltage source control block (providing the voltage source) may be used to set the value of load current 350. Further, the voltage source control block may operate to (further) increase the current through string 310 if one or more current source settings in the is 0 A, as described above.

Similarly, when multiple serially-connected strings are connected in parallel, as illustrated with respect to FIG. 4, the respective voltage source control blocks (providing voltage source 420 and 430 respectively) may be used to set the magnitudes of the respective currents $I_{L1}$ and $I_{L2}$. In addition, the corresponding voltage source control block(s) may add a respective voltage in series with the corresponding string, as noted above. Additionally, the voltage source control blocks may also operate to (further) increase the currents through the respective strings if one or more current source settings in the corresponding string(s) is 0 A, as also described above.

The communication between the current source control blocks and the voltage source control block associated with a serially-connected string of solar panels may be performed using any of several techniques. In one embodiment, each control block contains a bluetooth transceiver, and the communication is performed wirelessly using the bluetooth communication protocol. In an alternative embodiment, each of the control blocks is connected to a single shared bus. The current source control blocks gain access to the bus using one of several possible arbitration mechanisms, and transfer information to the corresponding voltage source control block. Communication in the reverse direction, i.e., from the voltage source control block to the current source control blocks, also takes place via the shared bus. Other embodiments can be designed to use other techniques for communication between the control blocks, as will be apparent to one skilled in the relevant arts.

The description is continued with an illustration of the internal details of a control block.

8. Control Block

Figure 10:
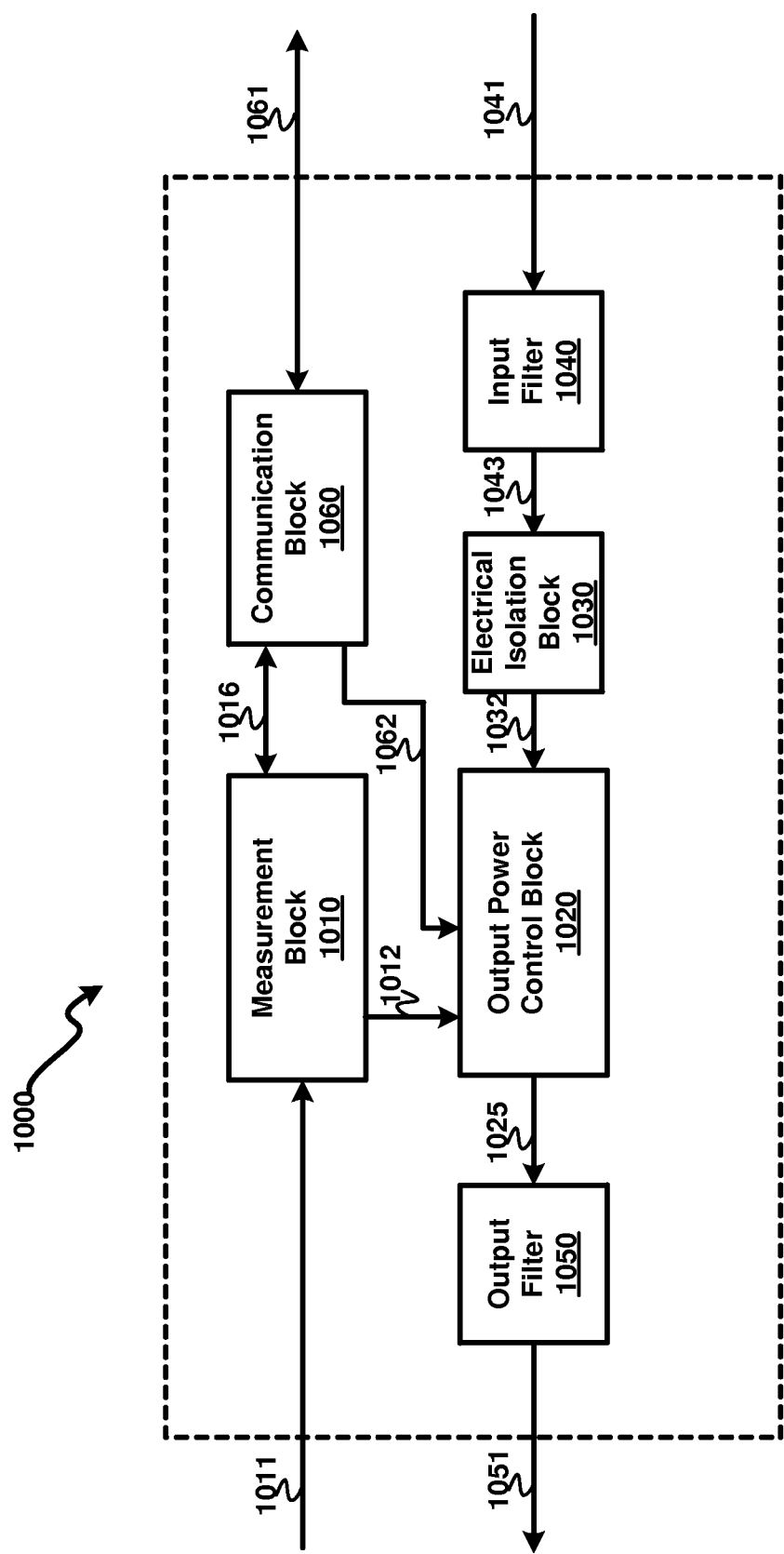
FIG. 10 is a block diagram of the internal details of a control block used in solar panel arrays, in an embodiment of the present invention.

FIG. 10 is a block diagram illustrating the details of a control block, in an embodiment of the present invention. Control block 1000, which can be implemented as the current source control blocks and voltage source control blocks of the description provided above, is shown containing measurement block 1010, output power control block 1020, electrical isolation block 1030, input filter 1040, output filter 1050 and communication block 1060.

Control block 1000 receives input power on path 1041. Input filter 1040 provides input-side filtering to the voltage received on path 1041, and provides a filtered voltage on path 1043. Electrical isolation block 1030, which may be implemented as a transformer, provides electrical isolation between the input power path 1041 and output power path 1051.

Output power control block 1020 receives the output of electrical isolation block 1030 on path 1032, and operates to control the magnitude of either an output voltage or an output current provided on path 1025. When control block 1000 is implemented as a current source control block, output power control block 1020 is designed to generate a current output on path 1025, and thus operates to provide a current source. Output power control block 1020 may receive commands on path 1012 from measurement block 1010 to change the magnitude of output current or output voltage generated on path 1025, and operate to provide the changed magnitude of output current or voltage. In addition, output power control block 1020 may also receive data on path 1062 from communication block 1060 specifying that the output current or output voltage be set to a specific magnitude.

When control block 1000 is implemented as a voltage source control block, output power control block 1020 is designed to generate a voltage output on path 1025. Output power control block 1020 may also receive data from current source control blocks via communication block 1060 and path 1062, with the data indicating the value of Ipp as well as the voltage corresponding to the MPP as determined by the current source control blocks. In response, output power control block 1020 may operate to change the magnitude of output voltage or output current provided on path 1025.

Output filter 1050 is used to filter the signal (current or voltage) on path 1025, and provides a filtered output on output path 1051.

Measurement block 1010 receives voltage inputs via measurement input path 1011, and operates to measure the magnitudes of the received voltages. Measurement block 1010, thus, performs the measurement of voltages performed by the current source control blocks described above. In response to the measured voltage values, and based on the MPP determination algorithm described in detail above, measurement block 1010 may generate commands on path 1012 specifying if output power control block 1020 needs to change the magnitude of output current 1020. Measurement block 1010 may communicate with external control blocks via communication block 1060 and path 1061. Thus, measurement block 1010 operates consistent with the operations described above needed to be performed to determine MPP of a panel. Measurement block 1010 may contain a memory unit internally for storage of measurement results.

Communication block 1060 operates to provide communication between control block 1000 and external components, specifically other control blocks in a solar panel array. Path 1061 represents a communication path on which communication block 1060 communicates with other control blocks. Based on the specific implementation, path 1061 may represent a wireless or wired communication medium. When control block 1000 is designed to communicate using bluetooth wireless protocol, communication block 1060 contains the transmitter and receiver portions of a bluetooth transceiver, and may be connected to wireless path 1061 via an antenna, not shown. When control block 1000 is designed to communicate on a wired path, communication block may include the corresponding interfaces (such as bus arbiter, line driver, etc). Communication block 1060, in combination with measurement block 1010, performs the corresponding operations described above to enable operation of the corresponding panel at its MPP.

With combined reference to FIG. 10 and FIG. 9A, path 1011 corresponds to the combination of paths 823, 824 and 825. Path 1051 corresponds to terminals 823 and 824. Path 1041 corresponds to terminals 821 and 822.

In an embodiment of the present invention, the combination of output power control block 1020, electrical isolation block 1030, input filter 1040 and output filter 1050 is implemented by a DC-DC converter, and may be implemented in a known way. For example, the DC-DC converter may be designed as a buck converter, boost converter, flyback converter, pulse-width modulated (PWM) converter, etc., as is well known in the relevant arts. Measurement block 1010 may be implemented using digital logic blocks (such as a processing unit), memory, and analog-to-digital converter. The memory may be implemented as a combination of volatile as well as non-volatile (non-transient) storage units. The non-volatile storage unit may be used to store instructions for execution by the processing unit. Thus, instructions for performing the MPP-determination operations described in detail above may be stored as a program in the non-volatile storage unit, and the processing unit may execute the instructions to enable determination of the MPP of a panel. In addition, the instructions may also perform communication with other control blocks to enable the determination of the MPP.

In the illustrations of FIGS. 3, 4, 5, 6, 7 and 9A although terminals/nodes are shown with direct connections to various other terminals, it should be appreciated that additional components (as suited for the specific environment) may also be present in the path, and accordingly the connections may be viewed as being electrically coupled to the same connected terminals.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. A system for generating electric power, said system comprising:
    a first DC source to provide a first voltage across a first node and a second node, wherein said first DC source is implemented in a form of a first set of photo-voltaic cells provided in a first panel;
    a second DC source to provide a second voltage across said second node and a third node, also in response to incidence of light, wherein said second DC source is implemented in a form of a second set of photo-voltaic cells provided in a second panel;
    a first current source coupled between said first node and said second node;
    a second current source coupled between said second node and said third node; and
    a first voltage source coupled in series with said first DC source and said second DC source to operate the system at maximum power,
    a second voltage source, wherein the output of said second voltage source is programmable;
    a third panel and a fourth panel connected in series with said second voltage source, the series combination of said third panel, said fourth panel and said second voltage source being coupled in parallel to the series combination of said first panel, said first voltage source, and said second panel between said first node and said third node;
    a third current source coupled in parallel to a third set of photo-voltaic cells contained in said third panel; and
    a fourth current source coupled in parallel to a fourth set of photo-voltaic cells contained in said fourth panel.

2. The system of claim 1, wherein each of said first DC source and said second DC source is implemented in the form of a corresponding set of photo-voltaic cells such that said first DC source comprise said first set of photo-voltaic cells and said second DC source comprise said second set of photo-voltaic cells.

3. The system of claim 2, wherein
said first panel and said second panel are connected in series at said second node.

4. The system of claim 3, wherein the output power of said system is provided across said first node and said third node,
wherein the current flowing through at least one of said first current source and said second current source is programmable to cause a current through said at least one of said first current source and said second current source to equal a current corresponding to a maximum power point (MPP) of the corresponding panel.

5. The system of claim 4, wherein both of said first current source and said second current source are programmable, the first current source being provided by a first control block and the second current source being provided by a second control block, the system further comprising a sense resistor coupled in series with said first panel,
wherein said first control block is designed to measure a load current flowing through said first panel by measuring a voltage drop across said sense resistor, the first control block also designed to determine a peak current (Ipp) corresponding to a maximum power point (MPP) of said first panel,
wherein the first control block generates, in said first current source, a current equal to a difference of said load current and said peak current (Ipp).

6. The system of claim 1, wherein the first current source is provided by a first control block, the second current source is provided by a second control block, the second voltage source is provided by a third control block, the third current source is provided by a fifth control block, the fourth current source is provided by a sixth control block, and a fourth control block sets output voltage of the second voltage source equal to a predefined voltage.

7. The system of claim 6, wherein each of said first control block, said second control block, said third control block, said fourth control block, said fifth control block and said sixth control block receives input power from said first node.

8. The system of claim 6, wherein each of said first control block, said fourth control block, said fifth control block, and said sixth control block receives input power from said first node,
wherein each of said second control block and said third control block receives input power from said second node, the system further comprising a seventh control block to provide a fifth current source coupled across said second node and said third node.

9. The system of claim 1, wherein if the sum of the voltage outputs of said first panel and said second panel corresponding to the respective MPPs of said first panel and said second panel is V1 volts, and if the sum of the voltages of said third panel and said fourth panel corresponding to the respective MPPs of said third panel and said fourth panel is V2 volts, said third control block sets the output voltage of said first voltage source to equal (V2−V1) volts and said fourth control block sets the output voltage of said second voltage source to equal zero volts, if V2 is greater than V1,
said third control block setting said output voltage of said first voltage source to equal zero volts and said fourth control block setting said output voltage of said second voltage source equal to (V1−V2) volts, if V1 is greater than V2, and
each of said third control block and said fourth control block setting said output voltage of said first voltage source and said output voltage of said second voltage source to zero volts if V1 equals V2.

10. The system of claim 1, further comprising an inverter coupled between said first node and said third node, the inverter to convert the output DC power provided across said first node and said third node to AC power.

11. A system for generating electric power, said system comprising:
a first set of photo-voltaic cells forming a first panel to provide a first voltage across a first node and a second node, in response to incidence of light;
a first current source coupled between said first node and said second node;
a first programmable voltage source coupled in series with said first panel between said first node and said second node, wherein DC output power of said system is provided across said first node and said second node, and
wherein said first current source is programmable to cause a first current corresponding to the maximum power point (MPP) of said first panel to flow through said first panel;
a second set of photo-voltaic cells forming a second panel, said second panel coupled between said first node and said second node in parallel with said first panel, said second panel to provide a second voltage across said first node and said second node, also in response to incidence of light;
a second current source coupled between said first node and said second node; and
a second programmable voltage source coupled in series with said second panel between said first node and said second node, wherein said second current source is programmable to cause a second current corresponding to the maximum power point (MPP) of said second panel to flow through said second panel.

12. The system of claim 11, wherein if voltage output of said first panel corresponding to the MPP of said first panel is V1 volts, and wherein if voltage output of said second panel corresponding to the MPP of said second panel is V2 volts, an output voltage of said first programmable voltage source is set equal to (V2−V1) volts and an output voltage of said second programmable voltage source is set to equal zero volts, if V2 is greater than V1,
said output voltage of said first programmable voltage source being set to zero volts and said output voltage of said second programmable voltage source being set to (V1−V2) volts, if V1 is greater than V2, and
each of said output voltages of said first programmable voltage source and said second programmable voltage source being set to zero volts if V1 equals V2.

13. The system of claim 11, wherein each of said first current source, said second current source, said first programmable voltage source and said second programmable voltage source is provided by a corresponding DC-DC converter.

14. The system of claim 11, further comprising an inverter coupled between said first node and said second node, the inverter to convert said DC output power to AC power.

15. A system for generating electric power, said system comprising:
a first set of photo-voltaic cells forming a first panel to provide a first voltage across a first node and a second node, in response to incidence of light;
a second set of photo-voltaic cells forming a second panel, said second panel coupled between said first node and said second node in parallel with said first panel, said second panel to provide a second voltage across said first node and said second node, also in response to incidence of light;

a first voltage source coupled in series with said first panel between said first node and said second node; and a second voltage source coupled in series with said second panel between said first node and said second node.

16. The system of claim 15, wherein if the voltage output of said first panel corresponding to the MPP of said first panel is V1 volts, and wherein if the voltage output of said second panel corresponding to the MPP of said second panel is V2 volts, the output voltage of said first voltage source is set equal to (V2−V1) volts and the output voltage of said second voltage source is set to equal zero volts, if V2 is greater than V1, the output voltage of said first voltage source being set to zero volts and the output voltage of said second voltage source being set to (V1−V2) volts, if V1 is greater than V2, and each of the output voltages of said first voltage source and said second voltage source being set to zero volts if V1 equals V2.

17. The system of claim 16, further comprising:

a first current source coupled across the output terminals of said first panel, wherein the current flowing through said first current source is programmable to cause a current corresponding to the maximum power point (MPP) of said first panel to flow through said first panel; and a second current source coupled across the output terminals of said second panel, wherein the current flowing through said second current source is programmable to cause a current corresponding to the maximum power point (MPP) of said second panel to flow through said second panel, wherein the DC output power of said system is provided across said first node and said second node, the system further comprising an inverter coupled between said first node and said second node to convert said DC output power to AC power.

* * * * *